US008582311B2

(12) United States Patent
Van Giesen et al.

(10) Patent No.: US 8,582,311 B2
(45) Date of Patent: Nov. 12, 2013

(54) MODULAR ELECTRONICS HOUSING

(75) Inventors: Bernd Van Giesen, Detmold (DE); Dirk Hanke, Lemgo (DE); Peter Stuckmann, Lage (DE); Stephan Lange, Lemgo (DE); Matthias Niggemann, Lemgo (DE); Georg Wagner, Leopoldshoehe (DE); Jens Brokmann, Detmold (DE); Katrin Wibbeke, Paderborn (DE); Heinz Scharlibbe, Porta Westfalica (DE); Andreas Wedler, Detmold (DE)

(73) Assignee: Weidmueller Interface GmbH & Co. KG, Detmold (DE)

( * ) Notice: Subject to any disclaimer, the term of this patent is extended or adjusted under 35 U.S.C. 154(b) by 235 days.

(21) Appl. No.: 13/201,457

(22) PCT Filed: Feb. 3, 2010

(86) PCT No.: PCT/EP2010/051304
§ 371 (c)(1),
(2), (4) Date: Aug. 14, 2011

(87) PCT Pub. No.: WO2010/094563
PCT Pub. Date: Aug. 26, 2010

(65) Prior Publication Data
US 2011/0299246 A1 Dec. 8, 2011

(30) Foreign Application Priority Data

Feb. 23, 2009 (DE) ............... 20 2009 002 498 U

(51) Int. Cl.
H05K 5/00 (2006.01)
H05K 5/04 (2006.01)
H05K 5/06 (2006.01)

(52) U.S. Cl.
USPC .......... 361/752; 361/724; 361/726; 361/727; 361/810

(58) Field of Classification Search
USPC ................... 361/724–759, 807–810
See application file for complete search history.

(56) References Cited

FOREIGN PATENT DOCUMENTS

| DE | 3304096 A1 | 8/1984 |
| DE | 8805804.2 U1 | 8/1988 |
| DE | 9420189.7 U1 | 6/1995 |
| DE | 29823669 U1 | 10/1999 |
| DE | 20004261 U1 | 2/2001 |
| DE | 20012572 U1 | 2/2001 |

*Primary Examiner* — Tuan T Dinh
(74) *Attorney, Agent, or Firm* — Lawrence E. Laubscher, Sr.; Lawrence E. Laubscher, Jr.

(57) ABSTRACT

A housing for protectively enclosing a printed circuit board, including a base, and a pair of parallel spaced vertical housing side walls extending upwardly from the base to define a chamber that receives the central portion of the printed circuit board, whereby the vertical edge portions of the board extend outwardly beyond the corresponding vertical edges of the housing side walls, respectively. Vertical side members having generally U-shaped horizontal cross-sectional configurations are mounted on the outwardly extending edge portions of the printed circuit board, respectively, with the leg portions of each side member extending between the housing side walls and the printed circuit board, respectively, whereby portions of housing side walls overlap the side member leg portions. The upper end of the chamber is closed by a lid member that is fastened between the upper ends of the side members.

13 Claims, 6 Drawing Sheets

MODULAR ELECTRONICS HOUSING

REFERENCE TO RELATED APPLICATIONS

This application is a national stage application under 35 U.S.C. 371 of International Application No. PCT/EP2010/051304 filed Feb. 3, 2010, which claims priority of German application No. DE 20 2009 002 498.9 filed Feb. 23, 2009.

BACKGROUND OF THE INVENTION

1. Field of the Invention

A housing for protectively enclosing a printed circuit board includes a base, and a pair of parallel spaced vertical housing side walls extending upwardly from the base to define a chamber that receives the central portion of the printed circuit board with the vertical edge portions of the board extending outwardly beyond the corresponding vertical edges of the housing side walls, respectively. Vertical side members having generally U-shaped horizontal cross-sectional configurations are mounted on the outwardly extending edge portions of the printed circuit board, respectively, with the leg portions of each side member extending between the housing side walls and the printed circuit board, respectively, whereby portions of housing side walls overlap the side member leg portions.

2. Description of Related Art

Electronic housings are known as such, but require further design optimization in terms of their electromagnetic breakdown protection or their ESD (Electro Static Discharge) protection.

In a simple manner, the present invention was developed to create the possibility of designing a synthetic substance housing with the electronics contained therein with a printed circuit board in a particularly ESD-protected manner.

Preferably, on at least one or on the printed circuit board, there is/are arranged one or several connector plugs, and the lateral part or the lateral parts can be locked upon the connector plugs. This definitely simplifies the assembly job because the plug connectors and the side parts are LP preassembled on the printed circuit board, and this sensitive part is well protected in the housing base during assembly. In this way, at least one printed circuit board with the plug connectors and the side parts constitute a pre-assembled unit that can be inserted in the housing base.

In a particularly preferred manner, the plug connectors are made as pin strips or socket boards. Other embodiments, for example, in the form of an RJ45 plug—or socket—are also conceivable.

Preferably, the printed circuit board, together with the plug connectors and the side parts, constitutes a preassembled unit that can be inserted in the housing base. That makes fabrication simple and particularly clear.

SUMMARY OF THE INVENTION

Accordingly, a primary object of the present invention is to provide a housing for protectively enclosing a printed circuit board, including a base, and a pair of parallel spaced vertical housing side walls extending upwardly from the base to define a chamber that receives the central portion of the printed circuit board, such that the vertical edge portions of the board extend outwardly beyond the corresponding vertical edges of the housing side walls, respectively. Two vertical side members having generally U-shaped horizontal cross-sectional configurations are mounted on the outwardly extending edge portions of the printed circuit board, respectively, with the leg portions of each side member extending between the housing side walls and the printed circuit board, respectively, whereby portions of housing side walls overlap the side member leg portions. The overlapping side wall portions have a width greater than 5 mm, and preferably from about 6 mm to 9 mm.

According to another object of the invention, the housing includes a lid member that is fastened between the upper ends of the side members, thereby to close the upper end of the chamber. When the printed circuit board and side member assembly is fully inserted into the chamber, locking ribs fasten the bottom portions of the side members to widened portions at the bottom of the base member. Consequently, the printed circuit board is enclosed completely within the housing in a protected shielded manner.

BRIEF DESCRIPTION OF THE DRAWINGS

Other objects and advantages of the invention will become apparent from a study of the following specification, when viewed in the light of the accompanying drawing, in which.

DETAILED DESCRIPTION OF THE INVENTION

Figure 1:
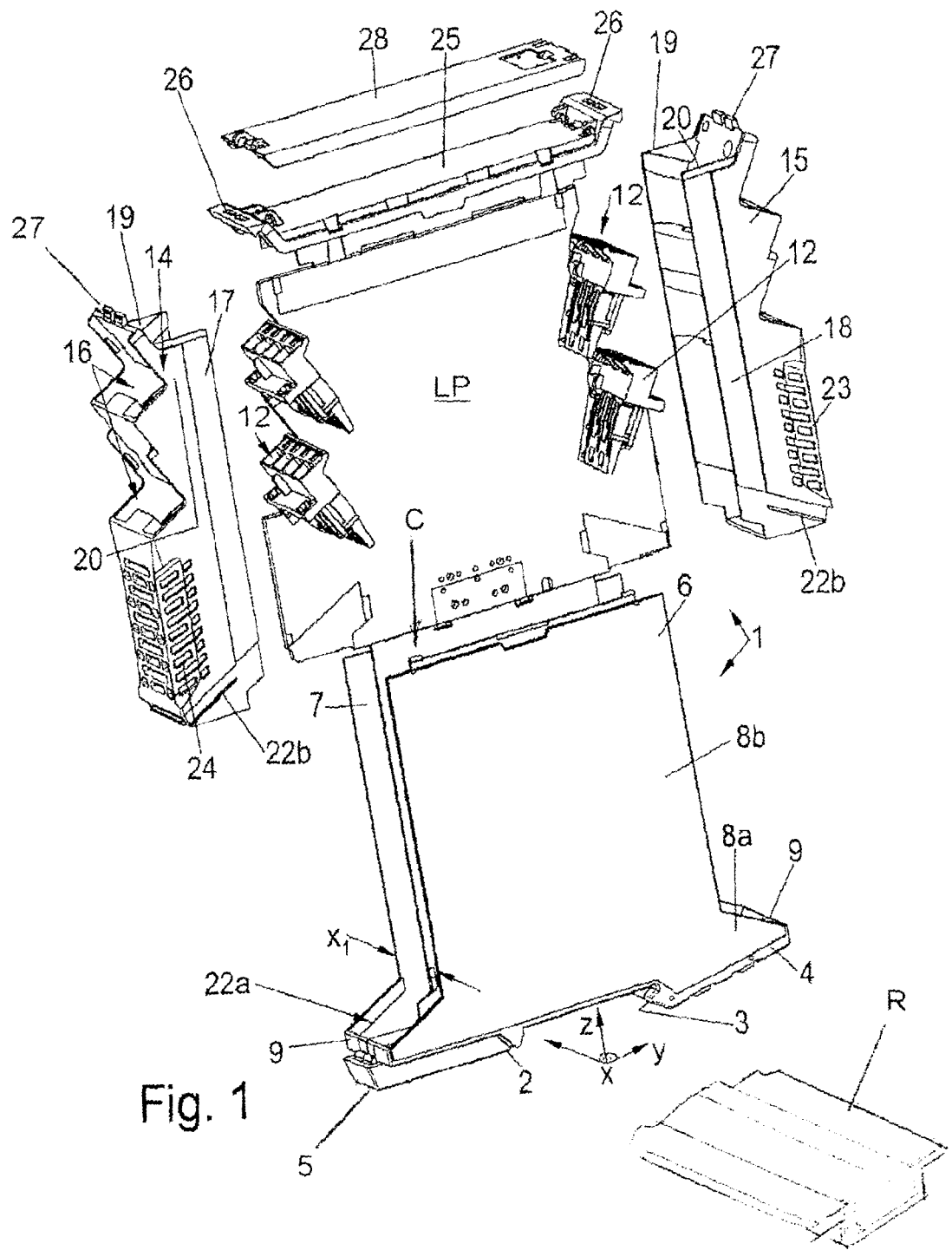
FIGS. 1 and 2 are exploded perspective and side elevation views, respectively, of the printed circuit board housing assembly.
Figure 2:
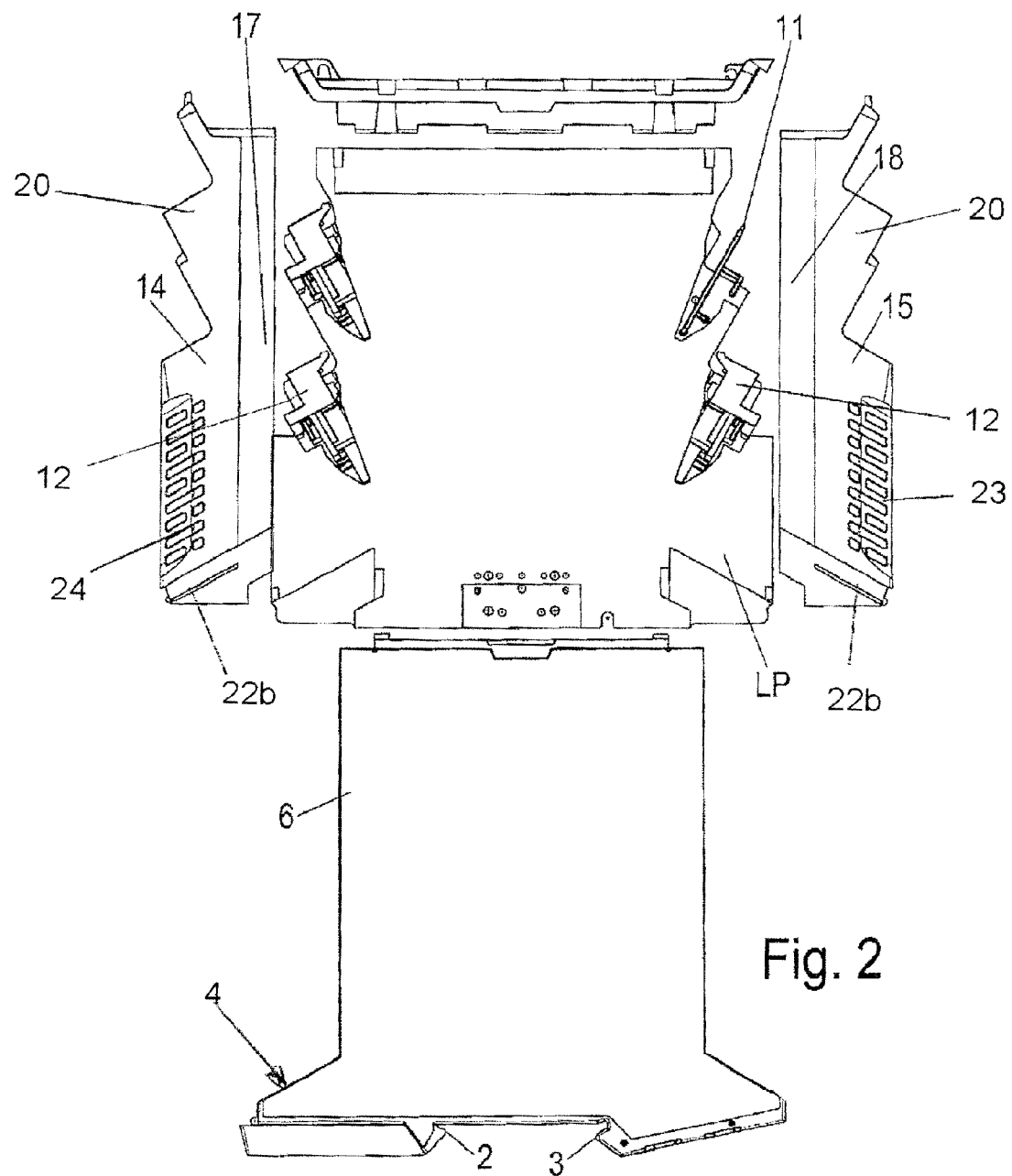

Referring first more particularly to FIGS. 1 and 2, the printed circuit board assembly 1 includes a horizontal base member 4 having a lower surface containing a recess having catch feet 2 and 3 for mounting the assembly on a conventional U-shaped high-hat type support rail R. Extending upwardly from the base member are a pair of parallel vertical spaced housing side walls 6 and 7 which cooperate with the base member to define a housing containing a chamber C for receiving a planar printed circuit board LP. The housing side walls, which are spaced by a given distance $x_1$, have an inverted T-shaped configuration such that the lower housing portion 8a is wider that the upper housing portion 8b. Fastening segments 9 connect the widened lower side edges of the side walls 6 and 7.

Figure 3:
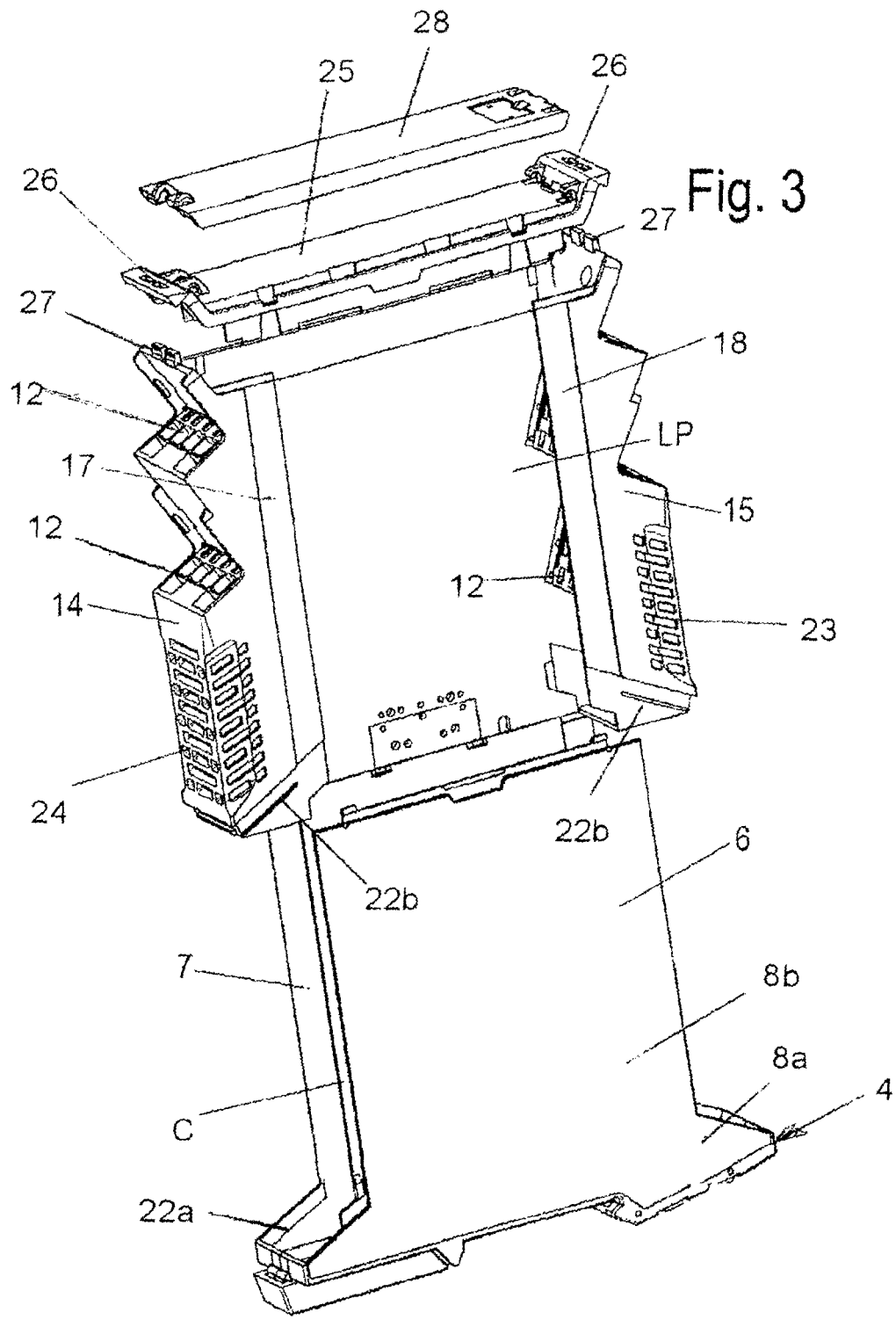
FIGS. 3 and 4 are perspective views of the apparatus of FIG. 1 when in first and second partially assembled conditions.
Figure 4:
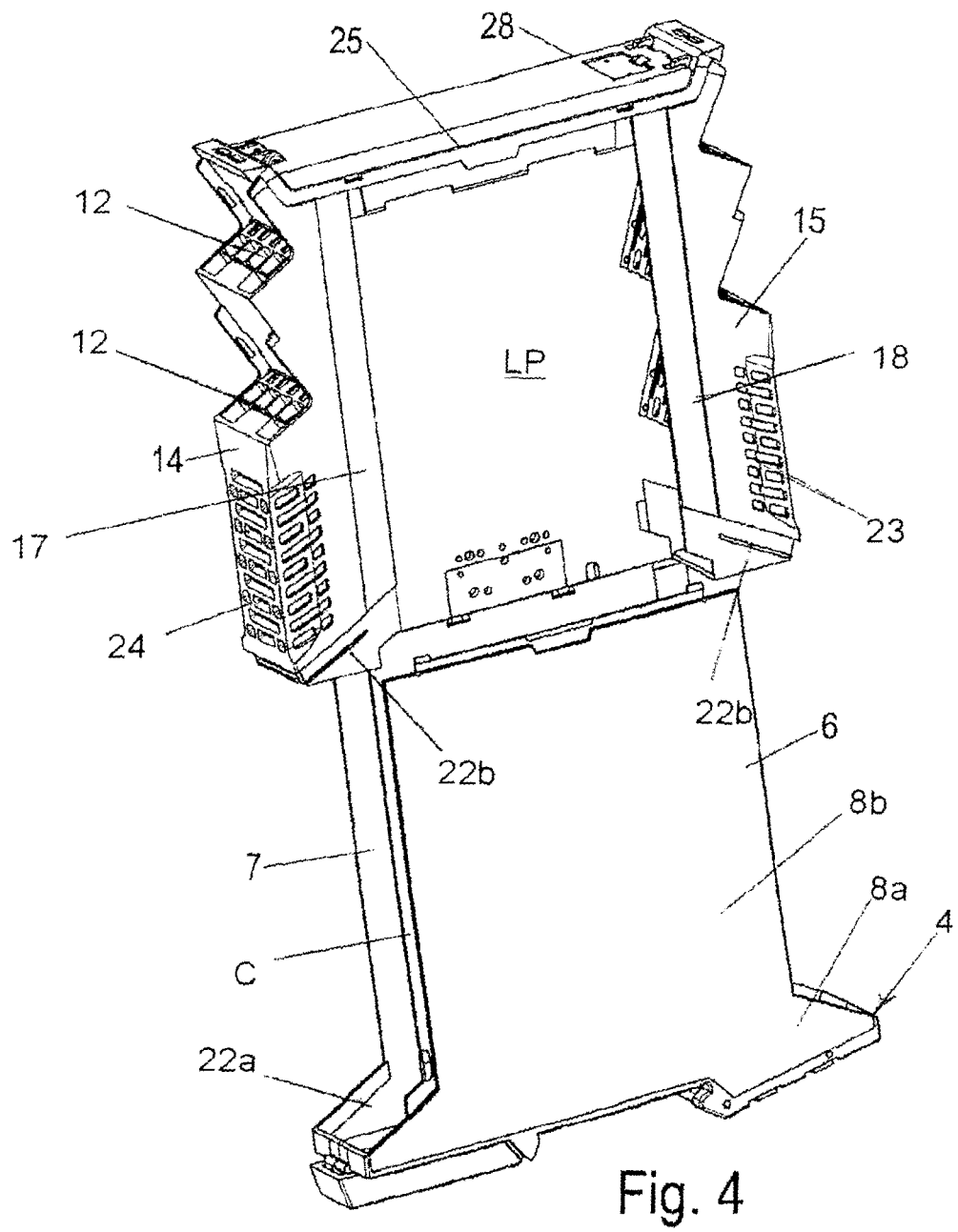

The two side edge portions of the printed circuit board LP have a sawtooth configuration for supporting pin strips 11 (FIG. 2) that mount a plurality of plug connectors 12 on both side edge portions. Two vertical side members 14 and 15 are provided having generally U-shaped cross-sectional configuration defining transverse body portions, pairs of vertical parallel spaced leg portions 17, 17 and 18, 18, respectively. As will be explained in greater detail below, the leg portions are slightly offset inwardly from the outer side surfaces 19, 20 of the side member transverse body portions. The spaced leg portions cooperate with the transverse body portions to define vertical grooves for receiving the edge portions of the printed circuit board carrying the plug connectors 12, as shown in FIG. 3. A lid member 25 is then fastened between the upper ends of the side members 14 and 15 by clasp elements 27 that extend upwardly from the side members through corresponding openings 26 contained in the ends of the lid member 25, as shown in FIG. 4, thereby locking the side members against the side edge portions of the printed circuit board LP, respectively. The side members contain access openings 16 (FIG. 1) that receive the plug connectors 12, respectively, as shown in FIGS. 3 and 4.

Figure 5:
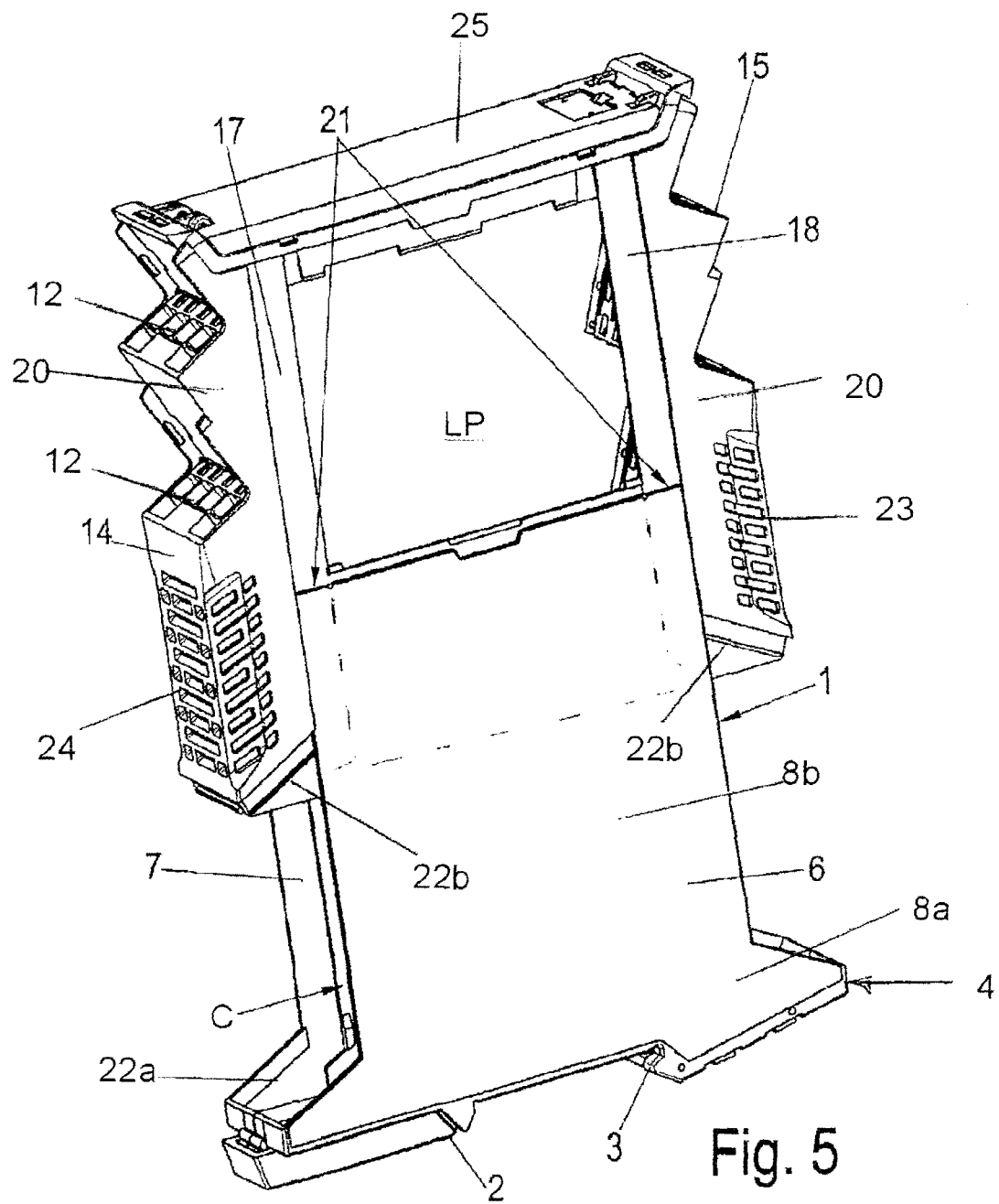
FIGS. 5 and 6 are perspective and side elevation views, respectively, with the apparatus of FIG. 1 in a third partly assembled condition.
Figure 6:
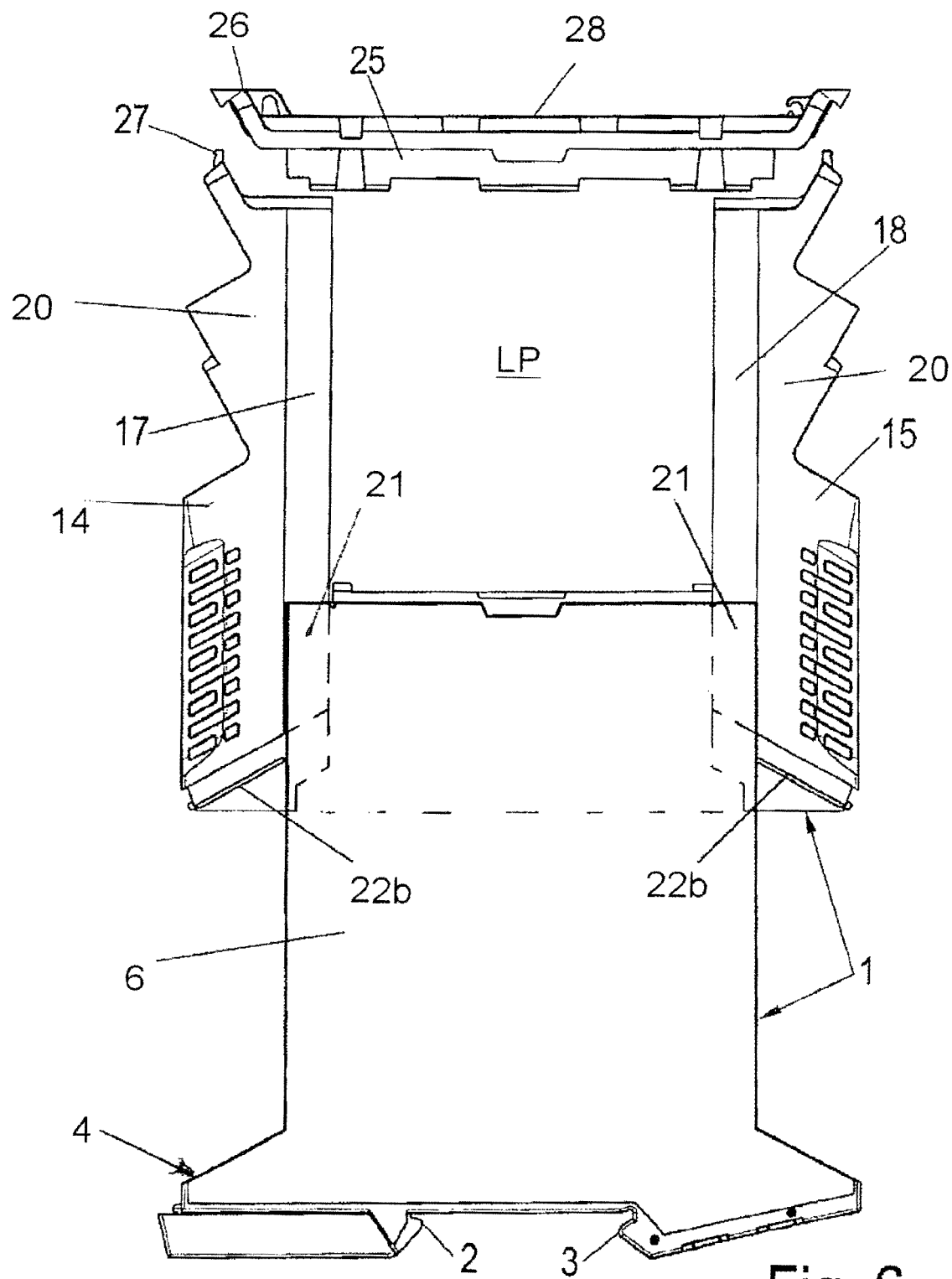

In accordance with a characterizing feature of the invention, the spacing distance between the outer surfaces of the legs 17, 17 and 18, 18 is less than the given spacing distance $x_1$ between the housing side walls, whereby when the printed circuit board LP is inserted downwardly into chamber C as shown in FIGS. 5 and 6, the legs 17, 17 and 18, 18 extend inside the housing walls 6 and 7. Consequently, when the printed circuit board and side member assembly of FIG. 4 is inserted downwardly in the chamber C as shown in FIGS. 5 and 6, edge portions 21 of the side walls 6 and 7 overlap the legs 17, 17 and 18, 18 of the side members 14 and 15. At this time, the edges of the transverse portions of the side members side members 14 and 15 slide along the vertical side edges of the sides walls 6 and 7. When the printed circuit board reaches the bottom of the chamber C, it is locked into place by the cooperation between locking ribs 22b on the side wall members 14 and 15 and corresponding locking ribs 22a on the broader base area 8a of the base 4.

A plurality of the printed circuit board housing assemblies 1 may be mounted in parallel spaced fashion on the mounting rail R.

Electronic housing 1 has a housing base 4, which is preferably made in one piece as an injection-molded part using synthetic materials.

Housing base 4, preferably furthermore toward the mounting rail, has a bottom section 5 (which here can be recognized only in the area of catch edge 3), which for the purpose of providing an ESD-proof variant can be made entirely or extensively closed or which can be provided with openings, for example, to put in air slits or air ducts in case of a less ESD-proof variant.

Bottom 5 preferably extends on both sides of the mounting rail. In the area of the catch foot, one can provide a means (not shown here) for the purpose of contacting a bus bar in the mounting rail.

Adjoining bottom area 5 are two side walls 6, 7 which lie at a distance of $X_1$—the grid dimension of the electronic housing. These side walls are subsequently referred to as main side walls 6, 7 (see FIG. 1). They predetermine the width $X_1$ of the electronic housing 1 in the alignment direction X.

The main side walls 6, 7 extend normal to the alignment direction X above the mounting rail. Looking at them in this direction from the mounting rail, they point in this direction "Z," first of all in a Y direction, then in a broader base area 8a, which extends on both sides of the mounting rails and in the Z direction above that base area 8 with a narrower area 8b so that the main side walls 6, 7—with relation to the mounting rail—essentially have the contour of a reverse T.

The printed circuit board LP preferably—at any rate, by sections—has almost sawtooth-like side contours, whereby graduated sections 10 (FIGS. 1, 2), which are made on the edge of the printed circuit board, are used for the purpose of—on the edge of the LP printed circuit board—arranging at least one or several pin strips 11 (or alternate socket strips), which is connected with the printed circuit board via contact areas (not recognizable here in individual detail) in a conducting manner, for example, by means of a soldering technique.

On the pin strip, one can place housings 12 that have connection chambers 13 that are separated from each other by partitions and that in each case are designed for receiving one of the connection pins of the pin strip 11 (see FIGS. 1 and 2).

Pin strips 11 in each case sit on the graduated segments 10 preferably in such a manner that they extend essentially perpendicularly on both sides of the printed circuit board edge, whereby they in each case rest on the lower legs of the graduated segments 10 in such a manner that the corresponding socket strips (not shown here) can be plugged in essentially from a direction with relation to the mounting rail, which is "from top to bottom."

In the area above the base between the main side walls 6, 7, housing base 4 does not have any side parts that are connected with it integrally and that would close off the electronic housing 1 all around.

Looking at the design involved in FIGS. 1 to 4, the side members 14, 15, which can be fixed on housing base 4 and which can be placed against the basic housing 1 and which can there be fixed in a preferably locking manner. They connect the main side walls 6, 7 with each other and are aligned perpendicularly with respect to them.

Looking at the top view, these side members 14, 15 essentially have a U-shaped contour.

In the side view shown in FIG. 3, the U-shaped side parts 14, 15 have a likewise sectionally graduated contour that is provided with recesses 16, which are so designed and arranged that the pin strips 11 come to lie in them in the assembled state, whereby it is possible to contact the pin strips 11 with the socket strips through the recess 16.

Side members 14, 15—particularly in the area of their longitudinal legs along the latter's edges in the Z direction—have edge sections 17, 18 in which the wall thickness of the side parts in the outer surfaces facing away from each other is somewhat less than in the rest of the area.

The interval between the longitudinal legs 19, 20 of side parts 14, 15 is so dimensioned that their outer interval will correspond to the interval $X_1$ of walls 6, 7. Edge sections 17, 18, on the other hand, are so designed that they will grasp in the direction of alignment behind wall 6, 7 from the inside in such a way that in the assembled state there will be formed an overlapping area 21 between edge sections 17, 18 and their walls 6, 7.

This overlapping area 21 is preferably in each case more than 5 mm wide. Preferably, for further optimization, it is 6 to 9 mm wide, in particular, it is 8 mm wide.

In the area in which the side parts 14, 15 engage the base area, there is likewise made a corresponding large overlapping area. Here, one may additionally provide that the ribs 22a, 22b will alternately grasp behind each other on the side parts and the base area, something which additionally secures side parts 14, 15 on the base part (FIG. 1).

In this way, it is possible to design the electronic housing in this lower area aligned toward the mounting rail in an electrotechnically particularly breakdown-proof manner, whereby in the preferred breakdown-proof design, one then does not put in any ventilation openings 23, 24 in the side walls (this variant is not illustrated here). In this way one can provide an enclose, electro-static-discharge proof electronic housing in a simple manner.

Preferably, all parts of the electronic housing, in other words, especially the base housing and the side parts 14, 15 consist of insulating synthetic substance.

Conceivably, however, one can also make side parts 14, 15 of metal and/or the components of the electronic housing can be fabricated by using different materials, for example, synthetic substance or metal.

In the X direction, electronic housing 1, shown in FIG. 1, extends, for example, for a distance of 12.5 mm.

The electronic housing 1 is closed up toward the top by a lid part 25, which can preferably be fixed on the side parts 14, 15 and on the main side walls 5, 6 in a locking or clamping manner. According to FIG. 1, this locking action is performed preferably in the manner of a clamp with openings 26 through which pass catch projections 27 on the side walls so that lid part 25 will prevent the side parts 14, 15 from being pulled apart perpendicularly with respect to the mounting rail (in the Y direction). Lid part 25 can also absorb other connections and/or can be used for marking purposes, and here again, it can possibly be provided with a preferably transparent cover 28.

It is conceivable to design electronic housing 1 in such a way that it will in each case hold two or more LP printed circuit boards (not shown here). Furthermore, for example, by changing the side parts or by different side parts 14, 15, one can make electronic housings with a more or less large ventilation function or a cooling function.

While side parts 14, 15 are here so designed that pin strips can be contacted upon them, the recesses 16 can also be so shaped that other connections can be reached through them, for example, plugs in the RJ45 format, light-conducting plugs or plugs or sockets of some other kind.

By means of the sawtooth shape, it is possible to build relatively high in the direction perpendicularly with respect to the mounting rail; this is advantageous because, in this direction, the structural space is mostly rather less limited.

While in accordance with the provisions of the Patent Statutes the preferred forms and embodiments of the invention have been illustrated and described, it will be apparent to those skilled in the art that changes may be made without deviating from the invention described above.

What is claimed is:

1. A housing for protectively enclosing a printed circuit board, comprising:
   (a) a base (4);
   (b) a pair of parallel spaced vertical housing side walls (6, 7) extending upwardly from said base, said base and said housing side walls cooperating to define a chamber, said side walls being spaced a given distance ($X_1$);
   (c) a vertical planar printed circuit board (LP) mounted in said chamber parallel with said housing side walls, said printed circuit board having a pair of vertical edge portions extending outwardly beyond the corresponding vertical edges of said side walls, respectively;
   (d) at least one plug connector (12) mounted on each of said printed circuit board extending vertical edge portions; and
   (e) a pair of vertical side members (14, 15), each of said side members having a generally U-shaped horizontal cross-sectional configuration including:
      (1) a vertical transverse body portion (14*a*, 15*a*); and
      (2) a pair of vertical parallel spaced leg portions (17, 18), said leg portions being spaced a distance less than said given side wall spacing distance, said leg portions cooperating with said transverse body portion to define a vertical groove;
   (f) said side members being mounted on said printed circuit board vertical edge portions with said printed circuit board extending edge portions being received in said side member vertical grooves, respectively, said side members containing access openings (16) opposite said plug connectors, respectively, the side member leg portions of each of said side members extending between said housing side walls and said printed circuit board, respectively, whereby portions (21) of said housing side walls overlap said side member leg portions.

2. A printed circuit board housing as defined in claim 1, wherein each of said housing side wall overlapping portions has a width of from about 6 mm to 9 mm.

3. A printed circuit board housing as defined in claim 2, wherein said given spacing distance ($X_1$) is about 12.5 mm.

4. A printed circuit board housing as defined in claim 1, wherein said housing base and side walls are formed of an ESD-proof synthetic plastic material.

5. A printed circuit board housing as defined in claim 1, and further including mounting pin strip means (11) for connecting said plug connectors with said printed circuit board.

6. A printed circuit board housing as defined in claim 1, and further including a horizontal lid member (25) connected between said side members to close the upper end of said chamber.

7. A printed circuit board housing as defined in claim 6, and further including connector means (26, 27) for connecting the ends of said lid member with said side members.

8. A printed circuit board housing as defined in claim 1, wherein each of said housing side walls has a generally inverted T-shaped configuration with a base portion (8*a*) thereof having a greater width dimension than the upper portion thereof (8*b*).

9. A printed circuit board housing as defined in claim 7, wherein said housing includes side wall segments (9) connected between the ends of said housing side wall base portions.

10. A printed circuit board housing as defined in claim 1, wherein said printed circuit board extending edge portions have a generally sawtooth configuration defining a plurality of vertically arranged recesses; and further wherein said plug connectors are mounted in said printed circuit board recesses, respectively.

11. A printed circuit board housing as defined in claim 1, wherein each of said side members contains a plurality of ventilation openings (23, 24).

12. A printed circuit board housing as defined in claim 1, wherein said base has a lower surface containing a recess provided with catch feet (2, 3) for connection with a U-shaped mounting rail.

13. A printed circuit board housing as defined in claim 8, wherein said housing side wall wider base portions (8*a*) include locking ribs (22*a*) that cooperate with corresponding locking ribs (22*b*) on said side members to lock said side members to said housing when said printed circuit board is completely inserted within said chamber.

* * * * *